United States Patent
Richards et al.

(10) Patent No.: US 7,207,054 B1
(45) Date of Patent: Apr. 17, 2007

(54) LOW NOISE BLOCK SUPPLY AND CONTROL VOLTAGE REGULATOR

(75) Inventors: Oliver L. Richards, Thompson, CT (US); Paul M. Greenland, Worcester, MA (US)

(73) Assignee: Allegro Microsystems, Inc., Worcester, MA (US)

( * ) Notice: Subject to any disclaimer, the term of this patent is extended or adjusted under 35 U.S.C. 154(b) by 485 days.

(21) Appl. No.: 09/441,119

(22) Filed: Nov. 17, 1999

(51) Int. Cl.
*H04N 7/20* (2006.01)
(52) U.S. Cl. ............................ 725/72; 725/69; 725/68; 455/3.02; 323/282; 323/289; 323/290
(58) Field of Classification Search ................... 725/68, 725/72, 149; 455/572; 323/282–290
See application file for complete search history.

(56) References Cited

U.S. PATENT DOCUMENTS

| | | | | |
|---|---|---|---|---|
| 5,345,591 A | * | 9/1994 | Tsurumaki et al. | 725/69 |
| 5,422,562 A | * | 6/1995 | Mammano et al. | 323/282 |
| 5,893,023 A | * | 4/1999 | Vizer | 455/3.02 |

OTHER PUBLICATIONS

"8284: Two Output LNB Supply and Control Voltage Regulator" Data sheet of Allegro MicroSystems, Inc., pp. 1-6, Jun. 16, 1999.
LNBP 10 Series LNBP20: LNB Supply and Control Voltage Regulator (Parallel Interface) Data sheet of ST, pp. 1-17, Sep. 1998.
"8284: LNB Supply and Control Voltage Regulator" Datasheet of Allegro MicroSystems, Inc., pp. 1-6, Dec. 7, 1998.
"LNBP22: LNB Supply and Control IC With Step-Up Converter AndI$^2$C Interface" Data sheet of ST, pp. 1-10, V.3.2—Dec. 1998.

* cited by examiner

*Primary Examiner*—Chris Kelley
*Assistant Examiner*—Usha Raman
(74) *Attorney, Agent, or Firm*—Daly, Crowley, Mofford & Durlee, LLP (57) ABSTRACT

A low power circuit for providing power and control signals to a low noise block converter of a satellite receiver over a single coaxial cable includes a tracking switch-mode power supply. The power and control signals have a DC voltage level selected from a plurality of DC voltage levels and are modulated by an analog AC tone signal. The switch-mode power supply provides a regulated output voltage which tracks the selected DC voltage level. The regulated output voltage provides the input voltage to an adjustable linear amplifier which generates an output voltage having the selected DC voltage level modulated by the analog AC tone signal.

14 Claims, 5 Drawing Sheets

LOW NOISE BLOCK SUPPLY AND CONTROL VOLTAGE REGULATOR

CROSS REFERENCE TO RELATED APPLICATIONS

Not applicable.

STATEMENT REGARDING FEDERALLY SPONSORED RESEARCH

Not Applicable.

BACKGROUND OF THE INVENTION

Satellite television receivers generally include a low noise block converter (LNB) at the satellite dish for controlling reception of satellite television signals. Functions of the LNB include downconverting received satellite signals, changing the frequency band of signal reception, changing the signal polarization of reception and, in some applications, controlling more than one receive antenna. For these purposes, the LNB requires control signals and power, both of which are provided by circuitry housed in the box located near the television set through which a user can change the channel of reception (sometimes referred to as the "set top box"). Since only a single coaxial cable couples the LNB to the set top box, the control and power signals are carried by the single coaxial cable.

EUTELSAT, a European organization which governs television satellite communications, establishes specifications for the low noise block converter control and power signals. Analog AC tone control signals are provided by a 22 kHz, 600 mV peak-to-peak signal which can be used to implement DiSEqC™ (Digital Satellite Equipment Control) encoding for the purpose of changing the polarization and frequency band of received RF signals. Digital control information which is also used to change the frequency band of received RF signals is transmitted as a nominal 13 volt DC signal for a logic zero and as a nominal 18 volt DC signal for a logic one. In practice however, a logic zero corresponds more broadly to voltages between approximately 12–14 volts and a logic one corresponds to voltages between approximately 17–20 volts. Power to the LNB circuitry itself is provided by whatever DC voltage is being used to transmit digital control information at any given time. Further, the LNB circuitry requires on the order of 0.6 amp of current.

Adjustable linear amplifiers are conventionally used to provide the control and power signals to the LNB. In this arrangement, the linear amplifier provides an AC modulated output voltage which has an adjustable DC voltage level in order to provide a logic one voltage level or a logic zero voltage level in response to control signals from a microprocessor within the set top box. In order to provide the logic one voltage levels, the minimum input voltage to the linear amplifier is required to be on the order 20 volts. However, when a logic zero voltage level of 12 volts is selected, the resulting power dissipation of the linear amplifier approaches 5 watts.

One attempt at lowering the power dissipation associated with the use of a linear amplifier to provide power and control signals to an LNB is the LNBP10 Series LNB Supply and Control Voltage Regulator product of ST Microelectronics of Lincoln, Mass. In this product, two input voltage levels are available to the linear amplifier, depending on which output voltage level is selected. The input voltage levels are provided by an unregulated AC/DC converter.

While the ST product somewhat reduces power dissipation as compared to the conventional linear amplifier arrangement, use of the ST product requires two windings on the power transformer of the AC/DC converter, only one of which is in use at any given time, thereby adversely impacting the efficiency of the converter. Further, even with two input voltage levels, the voltages dropped across the linear amplifier are still significant. As a result, power dissipation is still high enough to require relatively large package dimensions due to power dissipation and thermal considerations.

SUMMARY OF THE INVENTION

It is an object of the invention to provide a low power circuit for generating power and control signals for a low noise block converter (LNB).

It is a further object of the invention to provide an LNB supply and control voltage regulator which can be housed in a smaller package with reduced heat sinking requirements than heretofore possible.

These and other objects of the invention are provided by an LNB supply and control voltage regulator which includes a DC/DC switch-mode power supply providing a regulated output voltage to a linear amplifier. The output voltage of the linear amplifier has an adjustable DC voltage level and is modulated by an analog AC tone signal to provide power and control signals to an LNB of a satellite receiver over a single conductor. The regulated output voltage of the DC/DC switch-mode power supply tracks the selected DC voltage level, so as to minimize the voltage drop across the linear amplifier.

More particularly, the switch-mode power supply has an input port to which a DC input voltage is applied, a feedback port responsive to a reference voltage indicative of the selected DC voltage level, and an output port at which the regulated, tracking output voltage is provided. The regulated output voltage is greater than the selected DC voltage level by a predetermined offset voltage. The linear amplifier has an input port coupled to the output port of the switch-mode power supply, a control port to which the reference voltage indicative of the selected DC voltage level is applied, and an output port at which an output voltage having the selected DC voltage level modulated by the analog AC tone signal is provided.

With this arrangement, the voltage dropped across the linear amplifier is minimized since the input voltage to the linear amplifier is maintained at the predetermined offset voltage greater than the amplifier's output voltage. The resulting lower power dissipation permits the LNB supply and control voltage regulator to be provided in the form of a monolithic integrated circuit having relatively small package dimensions, since heat sinking requirements are reduced.

It will be appreciated by those of ordinary skill in the art that the switch-mode power supply is capable of generating the different DC voltages necessary to provide the digital control signals and power to the LNB. However, use of the linear amplifier is desirable to inject the analog AC tone signal. Thus, while for most applications, the use of a switch-mode power supply to provide the input voltage to a linear amplifier would be considered redundant, in the described satellite receiver application, this combination provides significant benefits. Specifically, the linear amplifier facilitates modulation by the analog AC tone signal and the switch-mode power supply provides a tracking input voltage to the linear amplifier in order to significantly reduce the power dissipation otherwise associated with the linear amplifier.

The LNB supply and control voltage regulator further includes a signal generator for generating the analog AC tone signal and for applying the analog AC tone signal to the linear amplifier to modulate the output voltage of the linear amplifier. In one embodiment, the analog AC tone signal modulates the reference voltage input to the linear amplifier and in another embodiment, the analog AC tone signal modulates the feedback input of the linear amplifier.

In applications in which the LNB supply and control voltage regulator controls more than one receive antenna, the output port of the linear amplifier includes first and second output port portions and the output voltage is provided at a selected one of the first and second output port portions in response to an output port control signal.

In one embodiment, the switch-mode power supply has a buck topology and includes a current mode pulse-width-modulation controller. However, it will be appreciated that other converter topologies and control techniques may be used while still realizing the advantages of the present invention.

Also described is a method for providing power and control signals selected from a plurality of DC voltage levels and being modulated by an analog AC tone signal to satellite receiver apparatus on a single conductor. The method includes selecting one of the plurality of DC voltage levels and providing a regulated output voltage with a switch-mode power supply, with the regulated output voltage tracking the selected DC voltage level. The method further includes applying the regulated output voltage to a linear amplifier which provides an output voltage having the selected DC voltage level which is modulated by the analog AC tone signal.

BRIEF DESCRIPTION OF THE DRAWINGS

The foregoing features of this invention, as well as the invention itself, may be more fully understood from the following description of the drawings in which.

DETAILED DESCRIPTION OF THE INVENTION

Figure 1:
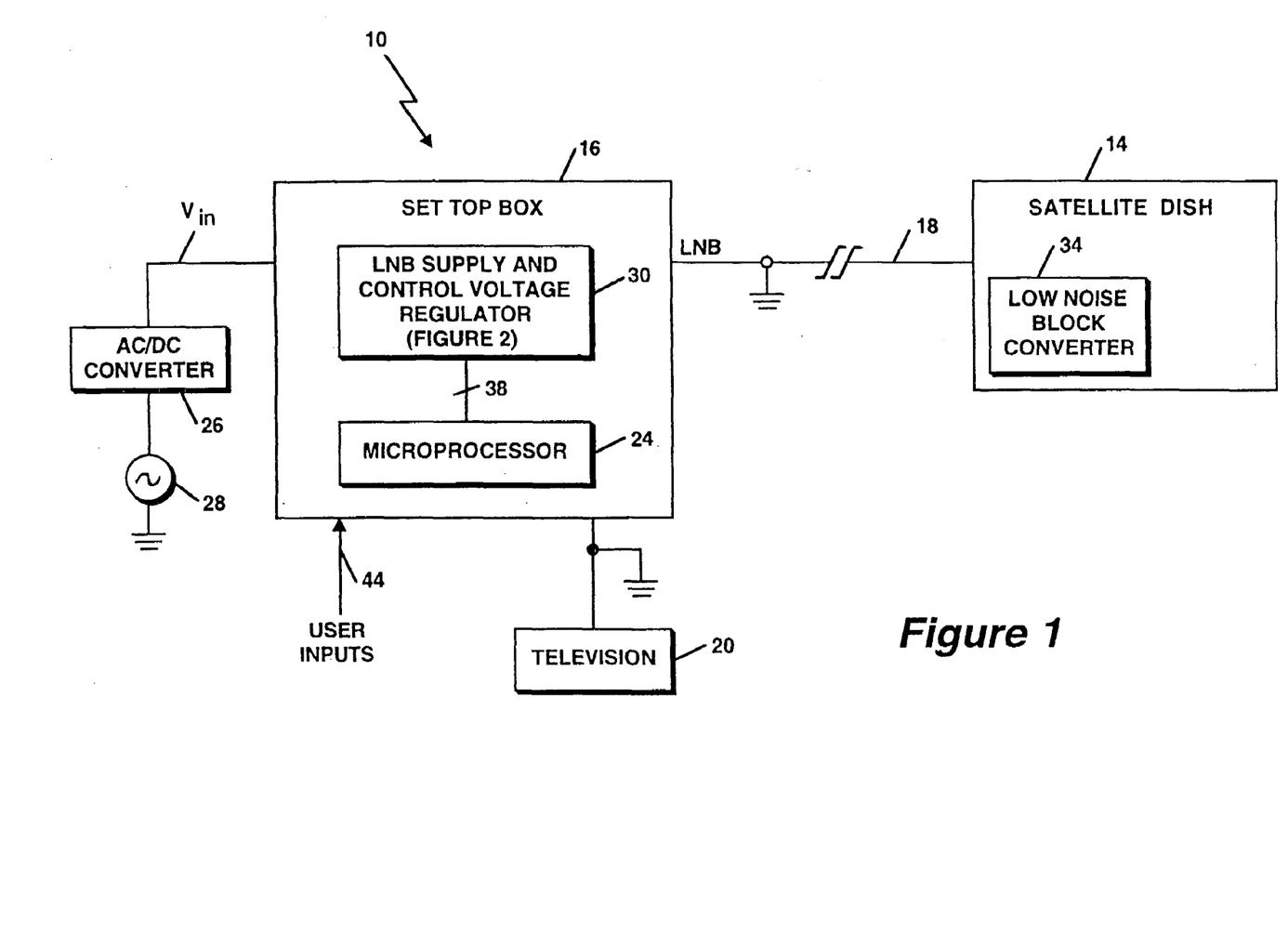
FIG. 1 is a block diagram of a portion of a satellite television receiver system including an LNB supply and control voltage regulator according to the invention.

Referring to FIG. 1, a portion 10 of a satellite television receiver system includes a satellite dish 14 having a low noise block converter (LNB) 34 for controlling reception of satellite television signals. The LNB 34 receives power and control signals from a set top box 16 via a single coaxial cable 18. The set top box 16 typically sits on top of, or adjacent to a television 20 and is response to input signals from the viewer to vary the frequency of signal reception. To this end, the set top box 16 includes a microprocessor 24 and an LNB supply and control voltage regulator 30 according to the invention.

The set top box 16 receives a DC input voltage, Vin, from an offline AC/DC converter 26 which is further coupled to a standard 120–240 volt AC source 28, as shown. The offline AC/DC converter 26 provides the Vin voltage between 22–47 volts.

As noted above, the control signals to the LNB 34 include an analog AC tone signal in the form of a 22 kHz, 600 mV peak-to-peak signal and digital control signals in the form of a nominal 13 volt DC signal for a logic zero and a nominal 18 volt DC signal for a logic one. In practice however, a logic zero corresponds more broadly to voltages between approximately 12–14 volts and a logic one corresponds to voltages between approximately 17–20 volts. Power to the LNB circuitry itself is provided by the digital control signal voltage. The LNB circuitry requires a current on the order of 0.6 amp.

The LNB supply and control voltage regulator 30 provides power and control signals to the LNB 34 in the form of an output signal, LNB, which has a DC voltage level selected from a plurality of levels to provide a logic one or logic zero and which is modulated by the analog AC tone signal. The LNB signal is provided to the LNB 34 at the satellite dish 14 via coaxial cable 18. The LNB supply and control voltage regulator 30 is responsive to signals 38, 44 for selecting the appropriate DC voltage level for the LNB signal. More particularly, the microprocessor 24 generates control signals 38 in response to user input signals 44 and the LNB supply and control voltage regulator 30 is further responsive to one or more additional user inputs 44, as will be described. It will be appreciated by those of ordinary skill in the art that the user input signals 44 may be provided by various user interface apparatus, such as with a remote control or with front panel switches.

Figure 2:
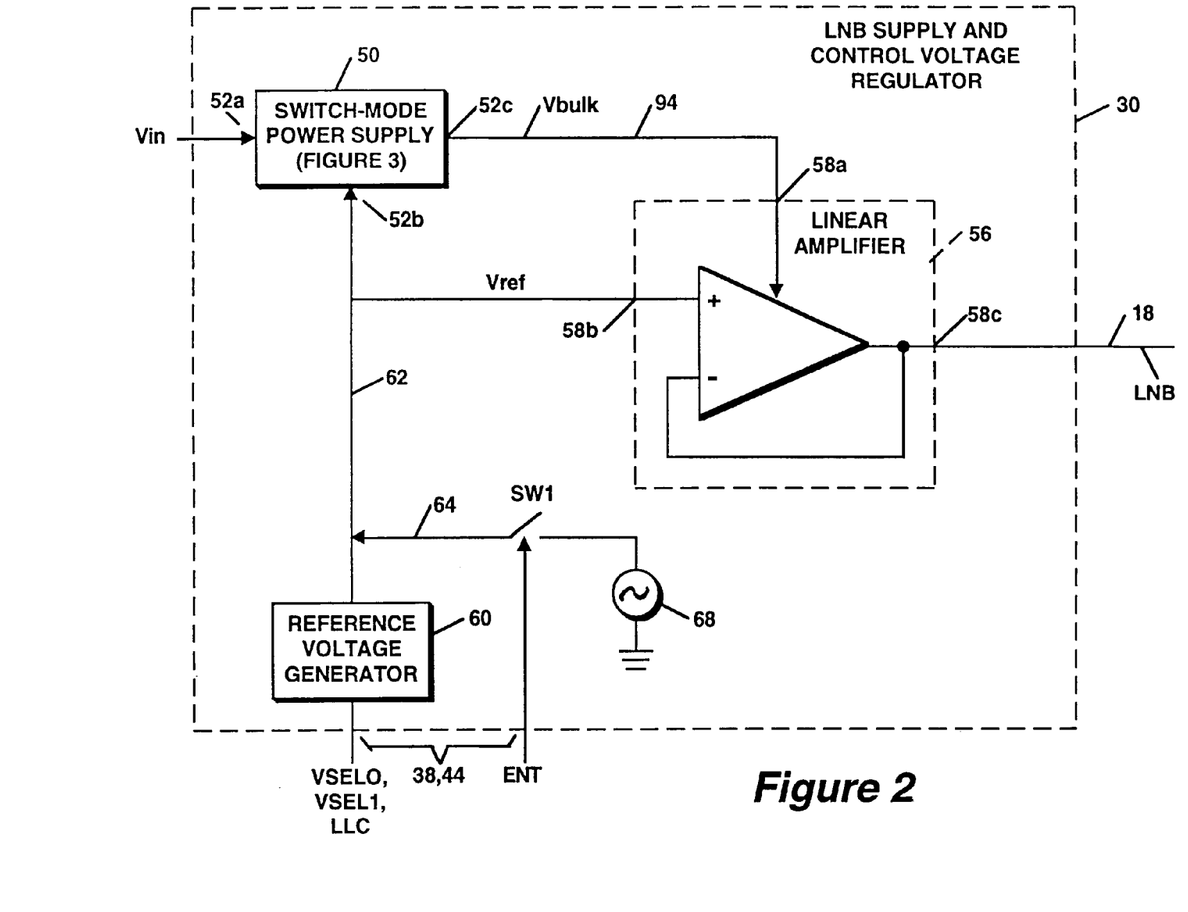
FIG. 2 is a block diagram of the LNB supply and control voltage regulator of FIG. 1.

Referring also to FIG. 2, the LNB supply and control voltage regulator 30 includes a switch-mode power supply 50 having an input port 52a to which the Vin voltage is applied, a feedback port 52b to which a reference voltage, Vref, is applied, and an output port 52c at which a regulated output voltage, Vbulk, is provided on signal line 94. The Vref voltage 62 is generated by a reference voltage generator 60 and is indicative of the selected DC voltage level for the LNB signal on line 18. The Vbulk voltage tracks the selected DC voltage level for the LNB signal. In particular, the Vbulk voltage is maintained at a predetermined amount greater than the voltage level of the LNB signal.

The LNB supply and control voltage regulator 30 further includes a linear amplifier 56 having an input port 58a coupled to the output port 52c of said switch-mode power supply 50, a control port 58b to which the Vref voltage is applied for selecting the DC voltage level of the LNB signal, and an output port 58c at which the LNB signal having the selected DC voltage level and being modulated by an analog AC tone signal is provided.

Figure 4:
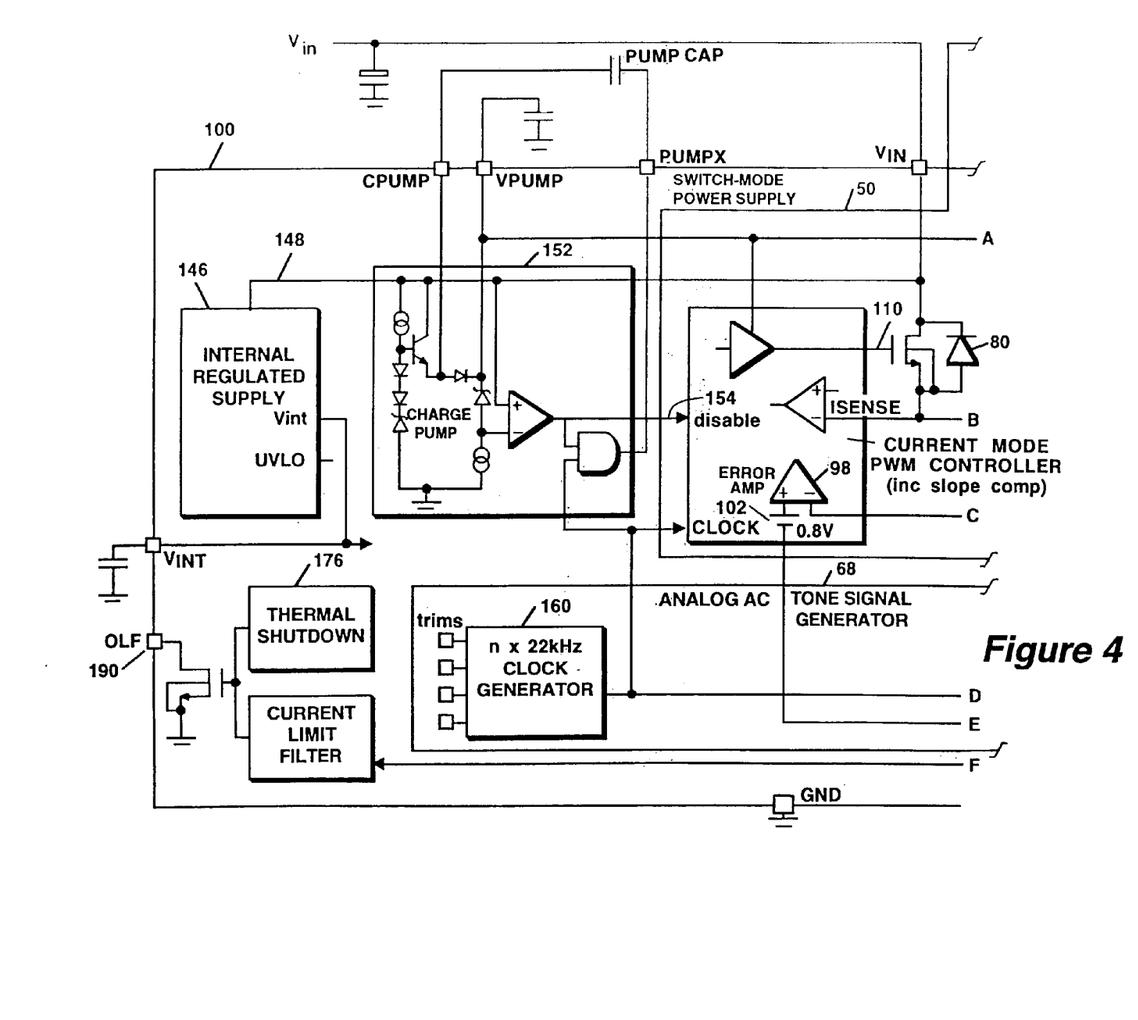
FIGS. 4 and 4A are a schematic of the LNB supply and control voltage regulator of FIG. 2.

The Vref voltage 62 sets, and is indicative of the DC voltage level of the LNB output signal. Thus, the Vref voltage is preferably provided by a high precision voltage source in order to ensure that the LNB signal represents the correct digital control information. Various circuits are suitable for generating a precise Vref voltage. One suitable reference voltage generator 60 is shown in FIG. 4 and described below.

In the illustrative embodiment, the Vref voltage 62 is equal to one-sixth of the selected DC voltage level of the LNB signal. It will be appreciated by those of ordinary skill in the art however that the Vref voltage may alternatively be equal to or may be otherwise proportional to, or indicative of the selected DC voltage level.

The Vref voltage 62 is generated by the reference voltage generator 60 in response to a VSEL0 control signal and a VSEL1 control signal from the microprocessor 24 (collectively labeled 38 in FIG. 1) and to an LLC user input signal 44. The VSEL0 and VSEL1 control signals in turn are generated by the microprocessor 24 in response to user input signals 44, such as a user channel selection selected via a remote control. The LLC user input signal 44 is provided by a switch setting on the set top box 16.

In the illustrative embodiment, the DC voltage level of the LNB signal is selected from 12, 13, 18 and 20 volts. Further, the LNB signal voltage optionally may be increased by 1 volt in order to compensate for voltage drop in the coaxial cable 18 (FIG. 1). A logic high LLC signal serves to increase the DC voltage of the LNB signal by 1 volt.

In the illustrative embodiment, the DC voltage level of the LNB signal is selected according to the following table and the reference voltage 62 is generated at a voltage level equal to one-sixth of the selected DC level:

| VSEL0 | VSEL1 | LLC = 0 | LLC = 1 |
|-------|-------|---------|---------|
| 0 | 0 | 13 volts | 14 volts |
| 0 | 1 | 18 volts | 19 volts |
| 1 | 0 | 12 volts | 13 volts |
| 1 | 1 | 20 volts | 21 volts |

The analog AC tone signal 64 is generated by an AC signal source 68 and can be applied the linear amplifier 56 to modulate its output voltage by various techniques. The block diagram of FIG. 2 illustrates one such technique in which the analog AC tone signal 64 modulates the Vref voltage 62 under the control of a switch SW1. Switch SW1 is controlled by an ENT tone enable signal 38 generated by the microprocessor 24 in response to a user input 44. More particularly, the microprocessor 24 uses a look up table to determine which of two possible antenna polarizations is required to receive RF signals corresponding to a particular channel selected by a user input 44. An alternative technique for applying the analog AC tone signal to the linear amplifier 56 is illustrated in FIG. 4 and described below.

The Vbulk output voltage 94 of the power supply 50 is maintained at a voltage level that is a predetermined amount greater than the LNB output signal. Further, the predetermined amount, or offset between the LNB signal and the Vbulk voltage is selected to be as small as possible while still providing sufficient input voltage to enable the linear amplifier to supply the selected output voltage, given the forward resistance and current supplied by the linear amplifier. In the illustrative embodiment, the predetermined offset voltage is on the order of 0.8 volts.

With this arrangement, the voltage drop across the linear amplifier 56 is maintained at the relatively low offset voltage and the power dissipation associated with the linear amplifier 56 is likewise minimized. In the illustrative embodiment, the power dissipation associated with the linear amplifier is on the order of one-half watt. Such lower power dissipation advantageously permits the monolithic LNB supply and control voltage regulator 30 to be provided in a relatively small and inexpensive package with lesser heat sinking requirements than conventionally possible. Thus, while in most applications, the use of a switch-mode power supply to provide the input voltage to a linear amplifier would be considered redundant, in the described satellite receiver application, this combination provides significant benefits.

Figure 3:
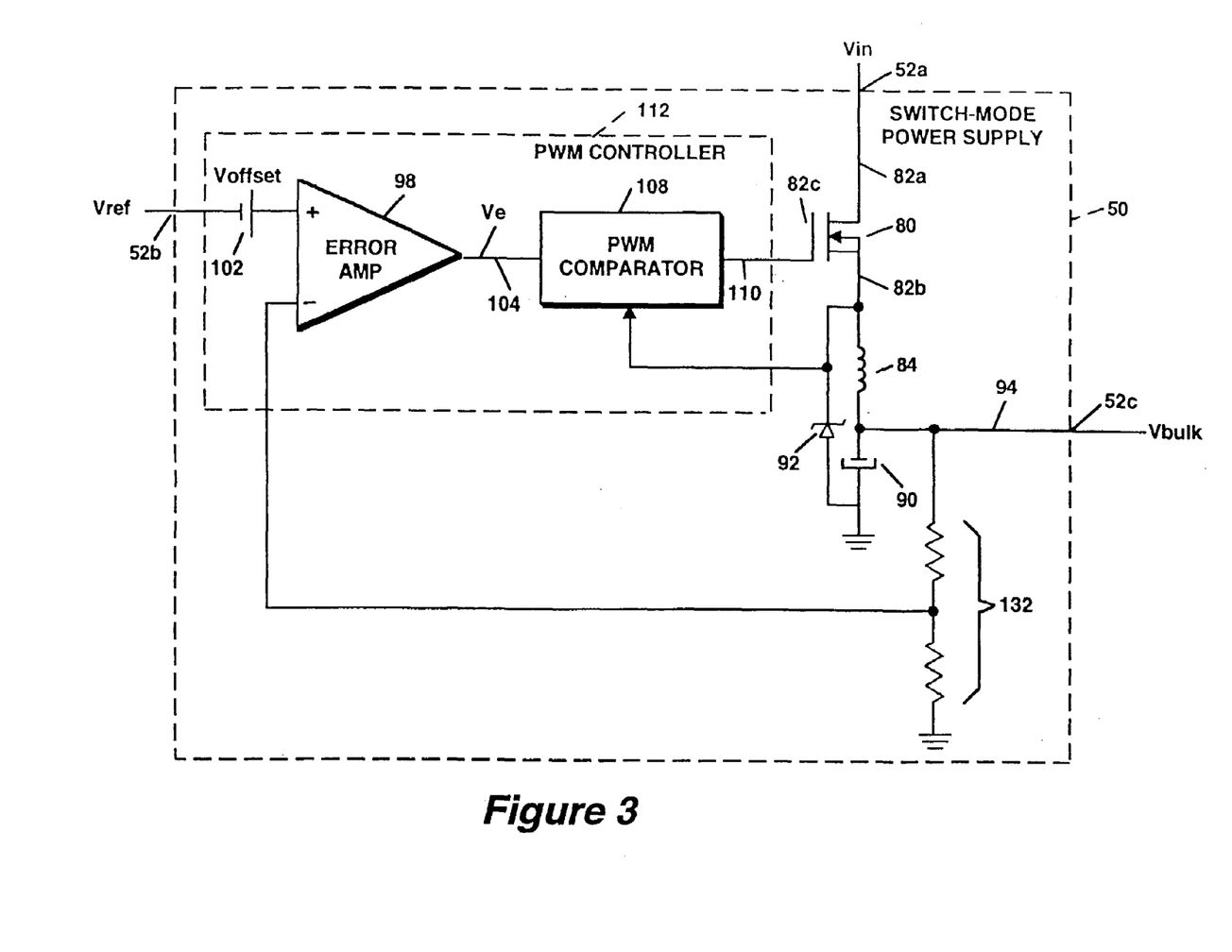
FIG. 3 is a simplified schematic of an illustrative switch-mode power supply for use in the LNB supply and control voltage regulator of FIG. 2.

Referring also to FIG. 3, an illustrative buck topology for the switch-mode power supply 50 of the LNB supply and control voltage regulator 30 is shown. It will be appreciated by those of ordinary skill in the art that other power supply topologies, such as a boost converter, may be utilized while still realizing the advantages of the present invention. The illustrated buck converter 50 is preferred since it steps down the Vin voltage with relatively high efficiency and low losses.

Input port 52*a* of the power supply 50 receives the DC Vin voltage and is coupled to a first terminal 82*a* of a power transistor 80. A second terminal 82*b* of the transistor 80 is coupled to an inductor 84 and a control terminal 82*c* of the transistor 80 is responsive to a transistor drive signal 110 from a pulse-width-modulation (PWM) controller 112. The illustrated transistor 80 is a N-type Metal Oxide Field Effect Transistor (MOSFET). However, it will be appreciated by those of ordinary skill in the art that other transistor types may be suitable for use in the power supply 50. In the illustrative embodiment, the Vin voltage is on the order of 22 to 47 volts and Vbulk output voltage on line 94 is between 12–21 volts.

The inductor 84 is further coupled to a capacitor 90 and to the output terminal 52*c* of the power supply at which the regulated Vbulk voltage is provided. A free-wheeling diode 92 is coupled across the series-coupled inductor 84 and capacitor 90, as shown.

The PWM controller 112 includes an offset voltage generator 102, an error amplifier 98, and a PWM comparator 108, as shown. The Vbulk output voltage is divided by resistor divider 132 and fed back to the inverting input terminal of the error amplifier 98. In the illustrative embodiment, the resistor divider 132 divides the Vbulk voltage by a factor of six. The Vref voltage is coupled to the non-inverting input terminal of the error amplifier 98 through the offset voltage generator 102, as shown. The offset voltage generator 102 adds a predetermined offset voltage, Voffset, to the Vref voltage.

The Ve error voltage 104 is coupled to the PWM comparator 108 which generates the transistor drive signal 110 by comparison of the Ve error voltage to a sawtooth waveform. In the illustrative embodiment, the PWM controller 112 is a current mode controller and thus, the sawtooth waveform is indicative of the power supply output current waveform. However, it will be appreciated by those of ordinary skill in the art that voltage mode controllers are likewise suitable for use in the power supply 50. The transistor drive signal 110 varies the duty cycle (ratio of on time to off time) of the transistor 80 as necessary in order to maintain the Vbulk voltage at a voltage level equal to the Voffset voltage plus the selected DC voltage level for the LNB signal. The Vbulk output voltage is equal to the Vin input voltage multiplied by the duty cycle of the transistor 80.

In operation, when the transistor 80 is on, the diode 92 is reverse-biased and the output current is supplied from the input source Vin through the transistor 80. When the transistor 80 is off, the diode 92 conducts and the output current is supplied by the inductor 84 and capacitor 90. The inductor 84 and capacitor 90 form an LC filter for reducing the ripple component of the Vbulk output voltage.

In the illustrative embodiment, the switching frequency of the power supply 50 is on the order of 352 KHz. However, it will be appreciated by those of ordinary skill in the art that the switching frequency can be readily varied in order to optimize known tradeoffs, such as component cost and the size of the LC filter.

With the above-described power supply 50, the Vbulk output voltage is maintained at a voltage level that is greater than the selected DC voltage level for the LNB signal by an amount equal to the Voffset voltage. Thus, only the Voffset voltage is dropped across the linear amplifier 56. In this way, the power dissipation associated with the linear amplifier 56 is minimized.

Figure 4A:
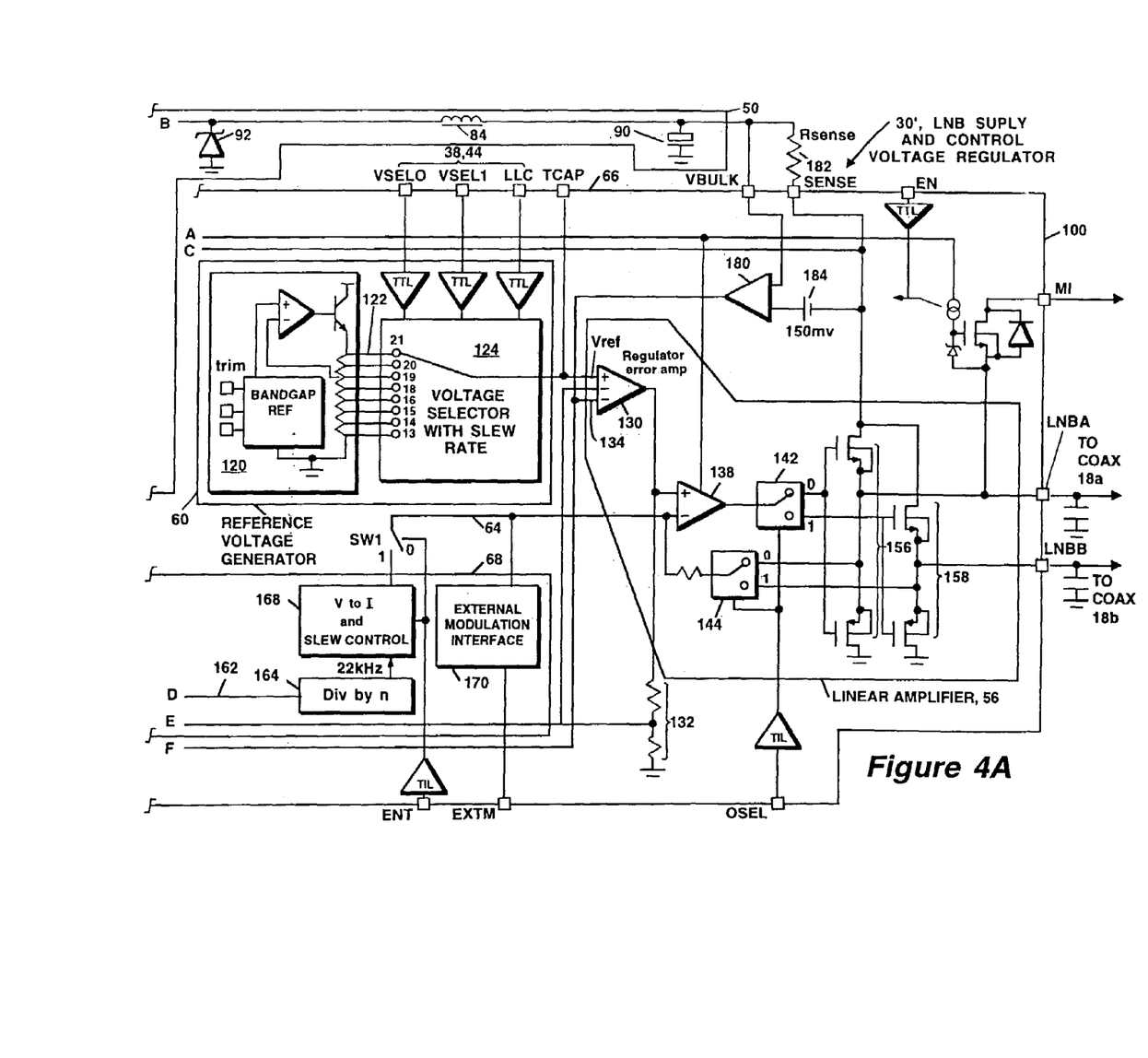

Referring also to FIGS. 4 and 4A, a schematic of an LNB supply and control voltage regulator 30' according to the invention is shown in which like components are designated by like characters. The regulator 30' is substantially similar to the regulator 30 of FIG. 2 with the following exceptions. First, the regulator 30' of FIG. 4 applies the analog AC tone signal to modulate the linear amplifier output signal by a different technique than is shown in FIG. 2. Further, the regulator 30' of FIG. 4 is designed to control a selected one of two receive antenna, or antenna heads. For this purpose, the regulator 30' includes a first output port LNBA and a second output port LNBB and the LNB signal is provided at a selected one of the LNBA and LNBB ports, as will be described. The regulator 30' includes additional circuitry not shown in the regulator 30 of FIG. 2, such as current limit and thermal shutdown circuitry, as will be described.

In the illustrative embodiment, the components within the border 100 are incorporated into a monolithic integrated circuit (IC). It will be appreciated by those of ordinary skill in the art however, that the regulator 30' may be provided entirely by discrete components or the components that are incorporated into the IC may be varied (i.e., some components illustrated as being on the IC may be provided off-chip and some components that are illustrated as being provided off-chip may be incorporated into the IC). In the illustrative embodiment, the IC is provided in a 24 pin dual in-line package (DIP) or an Small Outline IC (SOIC) power-tab package.

The LNB supply and control voltage regulator 30' includes switch-mode power supply 50, linear amplifier 56, reference voltage generator 60, and analog AC tone signal generator 68. The reference voltage generator 60 includes a bandgap voltage generator 120 which provides a plurality of precise voltage outputs 122. A voltage selector 124 is coupled to the outputs 122 of the bandgap voltage generator 120 and is responsive to VSEL0, VSEL1 control signals 38 from the microprocessor 24 (FIG. 1) and the LLC user input signal 44 for selecting the DC voltage level of the LNB signal and the Vref voltage 62 which, in the illustrative embodiment, is one-sixth the LNB signal voltage. The Vref voltage 62 is coupled to the linear amplifier 56, as shown. An external capacitor may be coupled to a TCAP terminal 66 of the IC 100 in order to set the rise and fall times of the LNB output signal by adjusting the slew rate of the Vref voltage 62.

The linear amplifier 56 includes an error amplifier 130 having a non-inverting input coupled to the Vref voltage 62, a first inverting input which receives a feedback signal from the output of the error amplifier through resistor divider 132, and a second inverting input 134 which receives a current limit signal. In operation, the error amplifier 130 maintains its output voltage at the level of the Vref voltage unless an overcurrent condition exists, in which case the output voltage of the error amplifier is decreased in order to thereby decrease the output current provided by the linear amplifier.

The linear amplifier 56 further includes a buffer 138 which has a first input coupled to the output of error amplifier 130 and a second input to which the AC tone signal 64 is applied. The buffer 138 modulates the output of the error amplifier 130 by the AC tone control signal. Thus, in the embodiment of FIGS. 4 and 4A, the AC tone signal 64 is applied to the feedback node of the linear amplifier 56; whereas, in FIG. 2, the AC tone signal 64 is applied to the Vref voltage.

A logic input signal OSEL provided to the IC 100 is used to select between the two output ports LNBA and LNBB of the linear amplifier 56. In particular, the OSEL signal controls a pair of switches 142, 144. In the illustrative embodiment, when the OSEL signal is at a logic high level, the LNBA output is disabled and the LNBB output is enabled; whereas, when the OSEL signal is at a logic low level, the LNBA output is enabled and the LNBB output is disabled. Each of the LNBA and LNBB outputs is coupled to a respective coaxial cable 18a, 18b which is further coupled to a respective antenna, or antenna head at a satellite dish 14 (FIG. 1).

More particularly, when the OSEL signal is at a logic high level, the first switch 142 couples the output of the linear amplifier buffer 138 to an LNBA output stage 156 and also couples the feedback input of the buffer 138 to the LNBA output stage 156. When the OSEL signal is at a logic low level, the second switch 144 couples the output of the linear amplifier buffer 138 to an LNBB output stage 158 and also couples the feedback input of the buffer 138 to the LNBB output stage 158. Output stages 156, 158 are capable of sourcing the required 0.6 amps of current to the LNB 34.

It will be appreciated by those of ordinary skill in the art that the topology of the linear amplifier 56 may be varied while still providing the functionality of buffering the Vref voltage 62 and modulating the linear amplifier output signal by the analog AC tone signal 64.

The switch-mode power supply 50 includes the power MOSFET 80 having a first terminal 82a to which the Vin voltage is coupled, a second terminal 82b coupled to the inductor 84 and to diode 92 and a control terminal 82c responsive to transistor drive signal 110. The transistor drive signal 110 is provided by the current mode PWM controller 112. The inductor 84 is further coupled to capacitor 90 across which the regulated Vbulk voltage is provided on signal line 94, as shown.

The Vbulk voltage is fed back to the PWM controller 112, and in particular is coupled to the inverting input terminal of the error amplifier 98. The non-inverting input terminal of the error amplifier 98 is coupled to the output of the linear amplifier error amplifier 130 through resistor divider 132 and offset voltage generator 102. The resistor divider 132 divides the LNB output voltage by six in the illustrative embodiment. The current sense PWM comparator 108 compares a waveform indicative of the Vbulk current to a voltage equal to the Voffset voltage plus the Vref voltage in order to provide the transistor drive signal 110 with the necessary duty cycle to maintain the Vbulk voltage at the LNB voltage plus the offset voltage. In the illustrative embodiment, the PWM controller 112 incorporates slope compensation.

An internal regulated supply 146 receives the Vin voltage and provides a regulated output voltage on signal line 148 to the IC circuitry including a charge pump 152. The charge pump 152 generates a voltage, VPUMP, which is on the order of 6V greater than the Vin voltage for powering the IC circuitry. The charge pump 152 further provides a disable signal 154 to the PWM controller 112 in order to disable the PWM controller if the VPUMP voltage falls below a predetermined level below which prevents the FET from conducting fully.

The analog AC tone signal generator 68 includes an n×22 KHz clock generator 160 providing a clock signal to the clock input of the PWM controller 112 and to a divider 164. In the illustrative embodiment, the clock generator 160 generates a clock signal 162 having a frequency of 352 KHz factory trimmed to +/−2 KHz. The divider 164 divides the frequency of the clock signal 162 by n, such as n=16 in the illustrative embodiment, to provide the 22 KHz AC tone signal 64 to a slew control circuit 168. The output of the slew control circuit 168 is coupled to the switch SW1 which is controlled by the ENT tone enable control signal. The ENT signal activates modulation of the linear amplifier output signal with the analog AC tone signal of 0.6 volts peak-to-peak and 22 KHz+/−2 KHz.

The analog AC tone signal generator 68 further includes an external modulation interface 170 which permits the linear amplifier output signal to be modulated by an external signal applied to an EXTM terminal of the IC 100.

The regulator 30' further includes current limit and thermal shutdown circuitry. The current limit circuit includes a comparator 180 and provides short circuit protection to the LNBA and LNBB outputs. The comparator 180 has an inverting input terminal responsive to the Vbulk voltage and a non-inverting input terminal responsive to the Vbulk current as provided by sense resistor 182 through an offset voltage generator 184. When the sensed current exceeds the Vbulk output voltage by an amount equal to the offset voltage 184, the output of the current limit comparator 180 transitions to a logic high level and causes the linear amplifier error amplifier 130 to decrease its output voltage and thus also to decrease the DC level of the LNB output voltage. The maximum current is set by adjusting the value of the sense resistor 182. In particular, in the illustrative embodiment, the maximum current is equal to 0.15 divided by the value of the sense resistor 182.

Various circuitry and techniques are suitable for monitoring for an overtemperature condition in order to provide a thermal shutdown function. As one example, a fixed voltage may be applied to a Darlington transistor 176 and the Vbe voltage monitored. An overtemperature condition is indicated if the Vbe voltage falls to below a predetermined level.

An OLF pin 190 of the IC 100 permits diagnostic information to be obtained. In particular, an over current condition, a short circuit condition, or thermal shutdown condition causes the voltage at the OLF terminal to transition to a logic low level in order to thereby indicate a fault condition.

The regulator 30' is capable of operating in a standby mode under the control of a logic input signal, EN. When the EN signal is at a logic low level, then both the LNBA and LNBB output signals are disabled. This feature allows the antenna downconverters to be supplied and controlled by other satellite receivers sharing the same coaxial cable 18 (FIG. 1).

Having described the preferred embodiments of the invention, it will now become apparent to one of ordinary skill in the art that other embodiments incorporating their concepts may be used.

It is felt therefore that these embodiments should not be limited to disclosed embodiments but rather should be limited only by the spirit and scope of the appended claims. For example, it will be appreciated by those of ordinary skill in the art that the circuitry and techniques described herein provide the same advantages in satellite systems other than television satellite systems. All publications and references cited herein are expressly incorporated herein by reference in their entirety.

What is claimed is:

1. A circuit for providing a power and control signal selected from a plurality of DC voltage levels and being modulated by an analog AC tone signal to satellite receiver apparatus on a single conductor, comprising:
   a switch-mode power supply having an input port to which an input voltage is applied, a feedback port responsive to a reference voltage indicative of said selected DC voltage level, and an output port at which a regulated output voltage is provided, wherein said regulated output voltage is greater than said selected DC voltage level by a predetermined amount; and
   a linear amplifier having an input port coupled to said output port of said switch-mode power supply, a control port to which said reference voltage indicative of said selected DC voltage level is applied, and an output port at which an output voltage having the selected DC voltage level and being modulated by the analog AC tone signal is provided.

2. The circuit of claim 1 wherein said satellite receiver apparatus comprises a low noise block converter of a satellite television system.

3. The circuit of claim 1 further comprising a signal generator for generating said analog AC tone signal and for applying said analog AC tone signal to said linear amplifier.

4. The circuit of claim 1 wherein said switch-mode power supply is a buck converter.

5. The circuit of claim 1 wherein said switch-mode power supply is a boost converter.

6. The circuit of claim 1 wherein said output port of said linear amplifier comprises a first output port portion and a second output port portion and wherein said output voltage of said linear amplifier is provided at a selected one of said first and second output port portions in response to an output port control signal.

7. A method for providing a power and control signal selected from a plurality of DC voltage levels and being modulated by an analog AC tone signal to satellite receiver apparatus on a single conductor, comprising the steps of:
   selecting one of said plurality of DC voltage levels;
   providing a regulated output voltage with a switch-mode power supply, said regulated output voltage having a voltage level greater than said selected DC voltage level by a predetermined amount; and
   applying said regulated output voltage to a linear amplifier, said linear amplifier providing an output voltage having said selected DC voltage level and being modulated by said analog AC tone signal.

8. The method of claim 7 further comprising the step of providing said output voltage of said linear amplifier to a low noise block converter of a satellite television system.

9. The method of claim 7 further comprising the steps of:
   generating said analog AC tone signal; and
   applying said analog AC tone signal to said linear amplifier.

10. The method of claim 7 wherein said linear amplifier provides said output voltage at a selected one of a plurality of output ports.

11. A circuit for providing a power and control signal selected from a plurality of DC voltage levels and being modulated by an analog AC tone signal to a low noise block converter of a satellite television system on a single coaxial cable, comprising:
   a switch-mode power supply having an input port to which an input voltage is applied, a feedback port to which a reference voltage indicative of said reference voltage level is applied, and an output port at which a regulated output voltage is provided, wherein said regulated output voltage is greater than said selected DC voltage level by a predetermined amount;

a linear amplifier having an input port coupled to said output port of said switch-mode power supply, a control port to which said reference voltage indicative of said selected DC voltage level is applied, and an output port at which an output voltage having the selected DC voltage level is provided; and a signal generator for generating said analog AC tone signal and for applying said analog AC tone signal to said linear amplifier, wherein said output voltage of said linear amplifier is modulated by said analog AC tone signal.

12. The circuit of claim 11 wherein said switch-mode power supply comprises:

an error amplifier having a first input responsive to said reference voltage, a second, feedback input, and an output at which an error signal is provided;

a pulse-width-modulation comparator responsive to said error signal for providing a transistor drive signal;

a transistor having a first terminal to which said input voltage is applied, a second terminal, and a control terminal responsive to said transistor drive signal; and an inductor having a first terminal coupled to said second terminal of said transistor and a second terminal at which said output voltage of said linear amplifier is provided, wherein said output voltage is coupled to said feedback input of said error amplifier.

13. The circuit of claim 12 further comprising an offset voltage generator coupled between said reference voltage and said first input of said error amplifier.

14. The circuit of claim 12 wherein said error amplifier and said pulse-width-modulation comparator comprise a current mode pulse-width-modulation controller.

* * * * *